US011870199B2

United States Patent
Nagano et al.

(10) Patent No.: US 11,870,199 B2
(45) Date of Patent: Jan. 9, 2024

(54) TERMINAL PROTECTION VOLTAGE DETECTOR CIRCUIT FOR PROTECTING TERMINALS OF POWER SUPPLY APPARATUS

(71) Applicant: OMRON Corporation, Kyoto (JP)

(72) Inventors: Masaaki Nagano, Kyoto (JP); Tomonori Watanabe, Kyoto (JP); Kohei Tanino, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 25 days.

(21) Appl. No.: 17/834,109

(22) Filed: Jun. 7, 2022

(65) Prior Publication Data

US 2022/0407247 A1  Dec. 22, 2022

(30) Foreign Application Priority Data

Jun. 16, 2021  (JP) ................................ 2021-100187

(51) Int. Cl.
*H01R 9/24* (2006.01)
*H02M 1/00* (2006.01)
(Continued)

(52) U.S. Cl.
CPC ........ *H01R 9/2441* (2013.01); *H02M 1/0009* (2021.05); *H02M 3/33569* (2013.01);
(Continued)

(58) Field of Classification Search
CPC .......... G05F 1/571; G05F 1/573; G05F 1/575; G05F 1/577; H02M 1/008; H02M 1/32; H01R 9/2441
See application file for complete search history.

(56) References Cited

U.S. PATENT DOCUMENTS

| | | | |
|---|---|---|---|
| 8,369,114 B2 * | 2/2013 | Lin | H02M 1/32 361/93.7 |
| 9,362,737 B2 * | 6/2016 | Yang | H02M 3/33507 |

(Continued)

FOREIGN PATENT DOCUMENTS

| | | |
|---|---|---|
| EP | 2388598 A2 | 11/2011 |
| JP | 2016116366 A | 6/2016 |

OTHER PUBLICATIONS

EPO Extended European Search Report for corresponding EP Application No. 22175679.4; dated Nov. 7, 2022.

*Primary Examiner* — Gary A Nash
(74) *Attorney, Agent, or Firm* — CANTOR COLBURN LLP

(57) ABSTRACT

A terminal protection voltage detector circuit is provided for protecting a terminal block having output terminals in a power supply apparatus. A current detector detects output currents flowing from the power supply apparatus to loads via output terminals, and a first comparator configured to compare a sum of the detected output currents with a predetermined first threshold and output a first comparison result signal when the sum of output currents is larger than or equal to the first threshold. A second comparator configured to compare a maximum value of detected output currents with a predetermined second threshold and output a second comparison result signal when the maximum value is equal to or larger than the second threshold. A current stop circuit stops a current from flowing from the power supply apparatus to the output terminals based on the first or second comparison result signal.

7 Claims, 1 Drawing Sheet

(51) Int. Cl.
*G05F 1/571* (2006.01)
*H02M 3/335* (2006.01)
*H02M 7/5395* (2006.01)
*H03K 17/081* (2006.01)
*H02M 1/32* (2007.01)

(52) U.S. Cl.
CPC .... *H02M 7/5395* (2013.01); *H03K 17/08104* (2013.01); *G05F 1/571* (2013.01); *H02M 1/008* (2021.05); *H02M 1/32* (2013.01)

(56) References Cited

U.S. PATENT DOCUMENTS

| | | | |
|---|---|---|---|
| 10,205,381 B1* | 2/2019 | Vinciarelli | H02M 3/158 |
| 2005/0127883 A1* | 6/2005 | Hoshino | H02M 1/32 |
| | | | 323/274 |
| 2007/0086223 A1* | 4/2007 | Uchida | H02M 1/32 |
| | | | 363/52 |
| 2008/0106245 A1* | 5/2008 | Aizawa | G05F 1/573 |
| | | | 323/277 |
| 2017/0317488 A1 | 11/2017 | Pydah et al. | |
| 2019/0280616 A1* | 9/2019 | Tanabe | H02M 7/5387 |
| 2022/0247317 A1 | 8/2022 | Jiang et al. | |

* cited by examiner

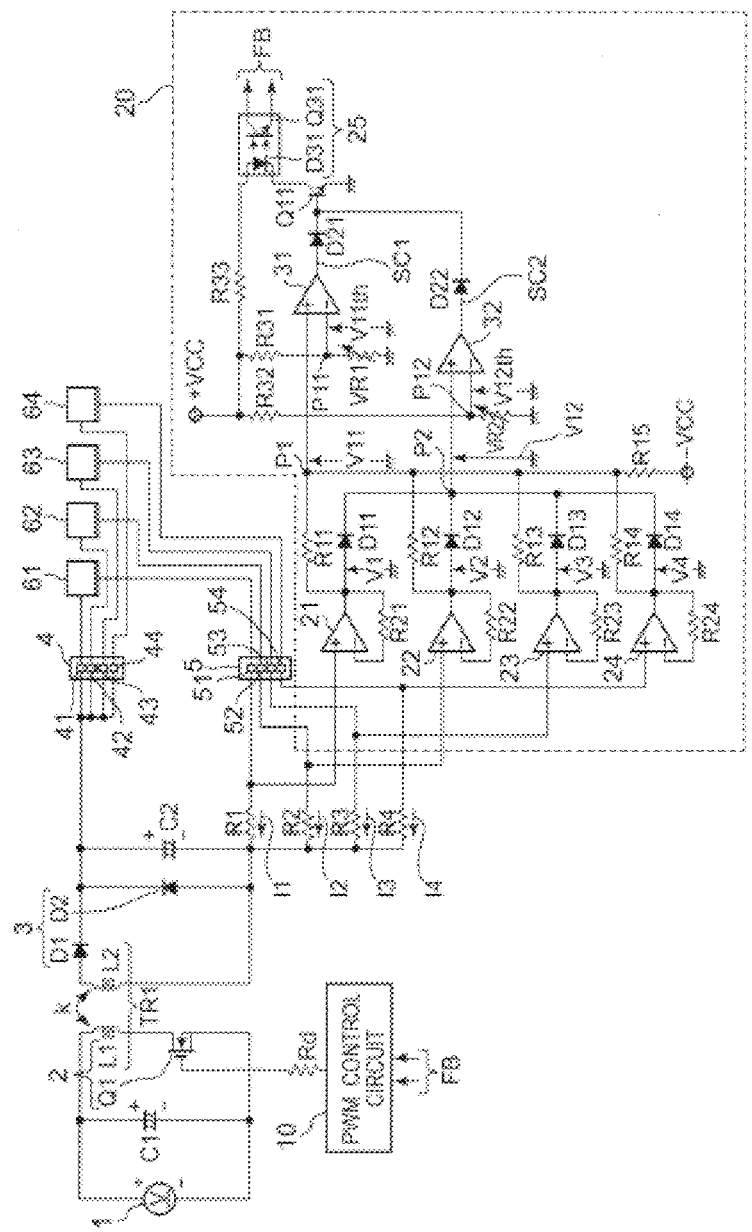

TERMINAL PROTECTION VOLTAGE DETECTOR CIRCUIT FOR PROTECTING TERMINALS OF POWER SUPPLY APPARATUS

CROSS REFERENCE TO RELATED APPLICATIONS

The present invention claims priority under 35 U.S.C. § 119 to Japanese Application, 2021-100187, filed on Jun. 16, 2021, the entire contents of which being incorporated herein by reference.

BACKGROUND OF THE INVENTION

Field of the Invention

The present disclosure relates to a terminal protection voltage detector circuit for protecting a plurality of terminals of a power supply apparatus, and a power supply apparatus including the terminal protection voltage detector circuit.

Description of Related Art

A power supply apparatus according to the prior art includes a terminal block having a plurality of output terminals for connecting a plurality of loads (see, for example, Patent Document 1). In this case, in general, for example, in the case of a power supply apparatus capable of outputting a large current, it is necessary to increase the size of a terminal block having a plurality of output terminals according to the output current.

PRIOR ART DOCUMENT

Patent Document:
Patent Document 1: Japanese Patent Laid-open Publication No. JP2016-116366A.

However, when the actual terminal block in the power supply apparatus is increased in size, the wiring becomes thick, and processing becomes difficult. In addition, even if the wiring is divided into each of loads in order to divide the output current, if the load is short-circuited and destroyed, the output current concentrates thereon, and there is a possibility that the wiring of the corresponding output terminal is burned out.

In addition, even in a case where the user intends to connect two wirings in parallel, but one wiring is not in contact due to erroneous connection, and the output current is concentrated on one wiring, there is a possibility that the wiring is burned out.

SUMMARY OF THE DISCLOSURES

An object of the present disclosure is to solve the above problems, and to provide a terminal protection voltage detector circuit capable of detecting the current of each of the output terminals and eliminating the burnout risk as described above, and a power supply apparatus including the terminal protection voltage detector circuit.

According to one aspect of the present disclosure, there is provided a terminal protection voltage detector circuit for protecting a terminal block having a plurality of output terminals in a power supply apparatus. The terminal protection voltage detector circuit includes a current detector, first and second comparators, and a current stop circuit. The current detector detectS a plurality of output currents flowing from the power supply apparatus to a plurality of loads via a plurality of output terminals, and the first comparator configured to compare a sum of the plurality of detected output currents with a predetermined first threshold and output a first comparison result signal when the sum of the plurality of output currents is larger than or equal to the first threshold. The second comparator configured to compare a maximum value of the plurality of detected output currents with a predetermined second threshold and output a second comparison result signal when the maximum value is equal to or larger than the second threshold. The current stop circuit stops a current from flowing from the power supply apparatus to the plurality of output terminals based on the first comparison result signal or the second comparison result signal.

Therefore, according to the terminal protection voltage detector circuit of the present disclosure, it is possible to detect the current of each of the output terminals and eliminate the above-described burnout risk.

BRIEF DESCRIPTION OF THE DRAWING

The FIGURE is a block diagram illustrating a configuration example of a power supply apparatus including a terminal protection voltage detector circuit 20 according to an embodiment.

MODE FOR CARRYING OUT THE DISCLOSURES

Hereinafter, embodiments according to the present disclosure will be described with reference to the drawing. The same or similar components are denoted by the same reference numerals.

Findings of the Inventor

As described above, in the power supply apparatus according to the prior art including the terminal block having the plurality of output terminals in order to connect the plurality of loads, for example, in the case of a power supply apparatus capable of outputting a large current, it is necessary to increase the size of the terminal block having the plurality of output terminals according to the output current. However, when the actual terminal block in the power supply apparatus is increased in size, the wiring becomes thick, and processing becomes difficult. In addition, even if the wiring is divided into each of the loads in order to divide the output current, if the load is short-circuited and destroyed, the output current concentrates thereon, and there is a possibility that the wiring of the corresponding output terminal is burned out. Therefore, it is necessary to prevent such a situation.

Therefore, the present inventor has devised a configuration in which overcurrent monitoring is performed in each of output terminals so that each of the output terminals does not exceed the rating. Specifically, after the output current of each of the output terminals is amplified by each of the differential amplifiers, the current control for protecting each of terminals and the current control of the total sum of the currents are simultaneously performed, so that the current control of each of the output terminals can be performed without greatly affecting the mounting area.

EMBODIMENTS

The FIGURE is a block diagram illustrating a configuration example of a power supply apparatus including a terminal protection voltage detector circuit 20 according to an embodiment.

Referring to the FIGURE, the power supply apparatus according to the embodiment is configured to include a DC power supply 1, a smoothing electrolytic capacitor C1, an inverter circuit 2, a rectifier circuit 3, a smoothing electrolytic capacitor C2, a resistor Rd, a PWM control circuit 10, a terminal block 4 having four output terminals 41 to 44, a terminal block 5 having four output terminals 51 to 54, current detection resistors R1 to R4, and a terminal protection voltage detector circuit 20. The inverter circuit 2 includes a MOS transistor Q1 and an inductor L1, and the rectifier circuit 3 includes two diodes D1 and D2 and configures a single-phase full-wave rectifier circuit. In this case, the inductors L1 and L2 configure a transformer TR1 electromagnetically coupled with a coupling degree k.

The PWM control circuit 10 is a drive control circuit of the inverter circuit 2, generates a PWM gate signal (drive control signal) having a predetermined period based on a feedback control signal FB from the terminal protection voltage detector circuit 20, and applies the PWM gate signal to the gate of the MOS transistor Q1 via the resistor Rd. As a result, the inverter circuit 2 generates an AC voltage by switching a DC voltage from the DC power supply 1 and outputs the AC voltage to the rectifier circuit 3. The PWM control circuit 10 generates a PWM gate signal based on the low-level feedback control signal FB and stops the generation thereof based on the high-level feedback control signal FB. The rectifier circuit 3 converts the input AC voltage into a DC voltage, and outputs the DC voltage to loads 61 to 64 via the current detection resistors R1 to R4 (only the negative side) and the output terminals (41, 51; 42, 52; 43, 53; 44, and 54) of the terminal blocks 4 and 5.

The terminal protection voltage detector circuit 20 is configured to include:
(1) a differential amplifier 21 having a feedback resistor R21, an output resistor R11, and an output diode D11,
(2) a differential amplifier 22 having a feedback resistor R22, an output resistor R12, and an output diode D12,
(3) a differential amplifier 23 having a feedback resistor R23, an output resistor R13, and an output diode D13,
(4) a differential amplifier 24 having a feedback resistor R24, an output resistor R14, and an output diode D14,
(5) a resistor R15,
(6) voltage-dividing resistors R31 and R32,
(7) variable resistors VR1 and VR2,
(8) an output resistor R33,
(9) comparators 31 and 32,
(10) output diodes D21, D22,
(11) a bipolar transistor Q11; and
(12) a photocoupler 25 having a light emitting diode D31 and a phototransistor Q31.

Each of the differential amplifiers 21 to 24 is a so-called operational amplifier and is configured to amplify and output a voltage having a difference obtained by subtracting a voltage applied to an inverting input terminal from a voltage applied to a non-inverting input terminal.

A voltage between both ends of the current detection resistor R11 (the voltage between both ends is proportional to an output current I1 flowing through the output terminal 51 or the load 61) is applied to the inverting input terminal of the differential amplifier 21, and the feedback resistor R21 is connected between the inverting input terminal and the output terminal. An output voltage V1 of the differential amplifier 21 is outputted to a non-inverting input terminal of the comparator 31 via the resistor R11 and a connection point P1 and is outputted to a non-inverting input terminal of the comparator 32 via the output diode D11 and a connection point P2.

A voltage between both ends of the current detection resistor R12 (the voltage between both ends is proportional to an output current I2 flowing through the output terminal 52 or the load 62) is applied to the non-inverting input terminal of the differential amplifier 22, and the feedback resistor R22 is connected between the inverting input terminal and the output terminal. An output voltage V2 of the differential amplifier 22 is outputted to the non-inverting input terminal of the comparator 31 via the resistor R12 and the connection point P1 and is outputted to the non-inverting input terminal of the comparator 32 via the output diode D12 and the connection point P2.

A voltage between both ends of the current detection resistor R13 (the voltage between both ends is proportional to an output current I3 flowing through the output terminal 53 or the load 63) is applied to the non-inverting input terminal of the differential amplifier 23, and the feedback resistor R23 is connected between the inverting input terminal and the output terminal. An output voltage V3 of the differential amplifier 23 is outputted to the non-inverting input terminal of the comparator 31 via the resistor R13 and the connection point P1 and is outputted to the non-inverting input terminal of the comparator 32 via the output diode D13 and the connection point P2.

A voltage between both ends of the current detection resistor R14 (the voltage between both ends is proportional to an output current I4 flowing through the output terminal 54 or the load 64) is applied to the non-inverting input terminal of the differential amplifier 24, and the feedback resistor R24 is connected between the inverting input terminal and the output terminal. An output voltage V4 of the differential amplifier 24 is outputted to the non-inverting input terminal of the comparator 31 via the resistor R14 and the connection point P1 and is outputted to the non-inverting input terminal of the comparator 32 via the output diode D14 and the connection point P2.

In this case, the connection point P1 is connected to a negative power supply voltage−VCC via the resistor R15. A positive power supply voltage+VCC is grounded via the voltage-dividing resistor R31 and the variable resistor VR1 and is grounded via the voltage-dividing resistor R32 and the variable resistor VR2. In addition, the positive power supply voltage+VCC is connected to an anode of the light emitting diode D31 of the photocoupler 25 via the resistor R33, and a cathode thereof is grounded via a collector and an emitter of the bipolar transistor Q11.

A voltage V11$th$ at a connection point P11 between the voltage-dividing resistor R31 and the variable resistor VR1 is set by adjusting the variable resistor VR1 so as to correspond to, for example, the rated current of the total current of the output terminals 51 to 54, and the voltage is applied to an inverting input terminal of the comparator 31 as a first threshold voltage V11. In addition, a voltage V12$th$ at a connection point P12 between the voltage-dividing resistor R32 and the variable resistor VR2 is set by adjusting the variable resistor VR2 so as to correspond to, for example, the rated current of each of the current flowing through the output terminals 51 to 54, and the voltage is applied to an inverting input terminal of the comparator 32 as a second threshold voltage V12.

In this case, the voltage V11 at the connection point P1 corresponds to be proportional to the sum (total current) of the currents flowing through the output terminals 51 to 54. In addition, the voltage V12 at the connection point P2 corresponds to be proportional to the maximum value of each of the currents flowing through the output terminals 51 to 54.

The comparator 31 applies a high-level comparison result signal SC1 to the base of the bipolar transistor Q11 via the diode D21 when V11≥V11th, and applies a low-level comparison result signal SC1 to the base of the bipolar transistor Q11 via the diode D21 when V11<V11th. In addition, the comparator 32 applies a high-level comparison result signal SC2 to the base of the bipolar transistor Q11 via the diode D22 when V12≥V12th, and applies a low-level comparison result signal SC2 to the base of the bipolar transistor Q11 via the diode D22 when V12<V12th.

In this case, the current detection resistors R1 to R4 (which may further include the differential amplifiers 21 to 24) are examples of a current detector, and the comparators 31 and 32 are examples of a comparator.

When any one of the comparison result signals SC1 and SC2 has the high level, the bipolar transistor Q11 is turned on, and as a result, the light emitting diode D31 emits light, the emitted light enters the phototransistor Q31, and the high-level feedback control signal FB is outputted to the PWM control circuit 10. On the other hand, when both of the comparison result signals SC1 and SC2 have the low level, the bipolar transistor Q11 is turned off, and as a result, the light emitting diode D31 is turned off, and the low-level feedback control signal FB is output from the photocoupler 25 to the PWM control circuit 10.

The operation of the power supply apparatus including the terminal protection voltage detector circuit 20 configured as described above will be described below.

The output currents I1 to I4 of the power supply apparatus return from the output terminals 41 to 44 of the positive-side terminal block 4 to the output terminals 51 to 54 of the negative-side terminal block 5 via the loads 61 to 64, respectively. In this case, the current I1 flowing through the output terminal 51 flows to the resistor R1, and the voltage between both ends of the resistor R1 is amplified by the differential amplifier 21 and then becomes the voltage V1. In addition, the current I2 flowing through the output terminal 52 flows to the resistor R2, and the voltage between both ends of the resistor R2 is amplified by the differential amplifier 22 and then becomes the voltage V2. Further, the current I3 flowing through the output terminal 53 flows to the resistor R3, and the voltage between both ends of the resistor R3 is amplified by the differential amplifier 23 and then becomes the voltage V3. Furthermore, the current I4 flowing through the output terminal 54 flows to the resistor R4, and the voltage between both ends of the resistor R4 is amplified by the differential amplifier 24 and then becomes the voltage V4.

In this case, since the output terminals 41 to 44, 51, and 54 of the terminal blocks 4 and 5 generally have the same shape, for example, the following equations are set:

$R1=R2=R3=R4$ $R11=R12=R13=R14$ (CASE 1) When a current larger than or equal to the rated current (corresponding to the second threshold voltage V12th) flows through any one of the output terminals 41 to 44 (when the maximum value of each of the currents flowing through the output terminals 41 to 44 becomes larger than or equal to the rated current), (1) $V1 \geq V12th$;
(2) $V2 \geq V12th$;
(3) $V3 \geq V12th$; or
(4) $V4 \geq V12th$, and
the comparison result signal SC2 becomes the high level.

At this time, the photodiode D31 of the photocoupler 25 is turned on to generate the high-level feedback control signal FB, and the generation of the PWM gate signal by the PWM control circuit 10 is stopped.

(CASE 2) When the output current of the entire power supply apparatus exceeds the rated current (corresponding to the first threshold voltage V11th):

(1) a current flowing through the output resistor R11 is V1/R11,
(2) a current flowing through the output resistor R12 is V1/R12,
(3) a current flowing through the output resistor R13 is V1/R13; and
(4) a current flowing through the output resistor R14 is V1/R14; and
since the combined current becomes larger than the current value of −VCC/R15 flowing from the negative power supply voltage−VCC, then the comparison result signal SC1 becomes the high level. At this time, the photodiode D31 of the photocoupler 25 is turned on to generate the high-level feedback control signal FB, and the generation of the PWM gate signal by the PWM control circuit 10 is stopped.

In the above case 1 or 2, when the current of the entire power supply apparatus exceeds the rated current amount (first threshold current) or when any one of the currents of the output terminals exceeds the rated current (second threshold current), the high-level feedback control signal FB is generated, and the generation of the PWM gate signal by the PWM control circuit 10 is stopped. As a result, it is possible to prevent the output terminals 41 to 44 and 51 to 54 of the terminal blocks 4 and 5 or the wirings thereof from being destroyed by burnout and to prevent an overcurrent from flowing through the power supply apparatus.

As described above, according to the embodiment, in a case where wiring is performed from a plurality of output terminals in order to cause a large current to flow, it is possible to prevent load damage and current concentration on the output terminals at the time of non-contact of the terminals, and it is possible to eliminate the risk of burnout of the output terminals and the wirings.

Modified Embodiments

In the above embodiment, the PWM control circuit 10 generates the PWM gate signal based on the feedback control signal FB to drive and control the inverter circuit 2. However, the present disclosure is not limited to this, and the inverter circuit 2 may be driven and controlled by a drive control circuit such as an FM control circuit using another method such as a method of controlling by frequency using an FM gate signal.

In the above embodiment, the terminal blocks 4 and 5 each having the four output terminals 41 to 44 and 51 to 54 are provided, but the present disclosure is not limited thereto, and a plurality of terminal blocks may be used.

In the above embodiment, the current detection resistors R1 to R4 are inserted on the negative sides of the output terminals, but the present disclosure is not limited thereto, and may be inserted on the positive sides of the output terminals.

In the above embodiment, the inverter circuit 2 is configured by a circuit that converts a DC voltage into an AC voltage, but the present disclosure is not limited thereto, and may be configured by a circuit that converts DC power into AC power.

In the above embodiment, the rectifier circuit 3 is configured by a circuit that converts an AC voltage into a DC voltage, but the present disclosure is not limited thereto, and may be configured by a circuit that converts AC power into DC power.

In the above embodiment, the inverter circuit 2 is configured using the MOS transistor Q1 as a switching element, but the present disclosure is not limited thereto, and may be configured using a switching element such as a thyristor.

What is claimed is:

1. A terminal protection voltage detector circuit for protecting a terminal block having a plurality of output terminals in a power supply apparatus, the terminal protection voltage detector circuit comprising:
   a current detector configured to detect a plurality of output currents flowing from the power supply apparatus to a plurality of loads via a plurality of output terminals,
   a first comparator configured to compare a sum of the plurality of detected output currents with a predetermined first threshold, and output a first comparison result signal when the sum of the plurality of output currents is larger than or equal to the first threshold,
   a second comparator configured to compare a maximum value of the plurality of detected output currents with a predetermined second threshold, and output a second comparison result signal when the maximum value is equal to or larger than the second threshold; and
   a current stop circuit configured to stop a current from flowing from the power supply apparatus to the plurality of output terminals based on the first comparison result signal or the second comparison result signal.

2. The terminal protection voltage detector circuit as claimed in claim 1,
   wherein the current detector converts each of the plurality of detected output currents into a plurality of voltage values,
   wherein the first comparator compares a sum of the plurality of converted voltage values with a predetermined third threshold, and outputs the first comparison result signal when the sum of the plurality of voltage values is equal to or larger than the third threshold, and
   wherein the second comparator compares a maximum value of the plurality of converted voltage values with a predetermined fourth threshold, and outputs the second comparison result signal when the maximum value is larger than or equal to the fourth threshold.

3. The terminal protection voltage detector circuit as claimed in claim 2,
   wherein the current detector converts each of the plurality of detected output currents into a plurality of voltage values and then amplifies the voltage values.

4. The terminal protection voltage detector circuit as claimed in claim 1,
   wherein the first threshold is a rated current value of the entire terminal block, and
   wherein the second threshold is a rated current value of each of the plurality of output terminals.

5. A power supply apparatus comprising a terminal protection voltage detector circuit,
   wherein the terminal protection voltage detector circuit is configured to protect a terminal block having a plurality of output terminals in a power supply apparatus,
   wherein the terminal protection voltage detector circuit comprises:
   a current detector configured to detect a plurality of output currents flowing from the power supply apparatus to a plurality of loads via a plurality of output terminals,
   a first comparator configured to compare a sum of the plurality of detected output currents with a predetermined first threshold, and output a first comparison result signal when the sum of the plurality of output currents is larger than or equal to the first threshold,
   a second comparator configured to compare a maximum value of the plurality of detected output currents with a predetermined second threshold, and output a second comparison result signal when the maximum value is equal to or larger than the second threshold; and
   a current stop circuit configured to stop a current from flowing from the power supply apparatus to the plurality of output terminals based on the first comparison result signal or the second comparison result signal, and
   wherein the power supply apparatus includes:
   an inverter circuit configured to convert DC power into AC power; and
   a rectifier circuit configured to convert AC power from the inverter circuit into DC power, and
   wherein the current stop circuit stops operation of the inverter circuit.

6. The power supply apparatus as claimed in claim 5,
   wherein the inverter circuit includes:
   a switching element configured to switch the DC power and converts the DC power into AC power; and
   a drive control circuit configured to generate a drive control signal, and output the drive control signal to a switching element, and
   wherein the current stop circuit stops generation of the drive control signal in the drive control circuit.

7. The power supply apparatus as claimed in claim 6,
   wherein the drive control signal is a PWM gate signal or an FM gate signal.

* * * * *